(12) United States Patent
Yu et al.

(10) Patent No.: US 10,743,411 B1
(45) Date of Patent: Aug. 11, 2020

(54) CERAMIC SUBSTRATE COMPONENT/ASSEMBLY WITH RAISED THERMAL METAL PAD, AND METHOD FOR FABRICATING THE COMPONENT

(71) Applicants: ICP Technology Co., Ltd., Taoyuan (TW); Industrial Technology Research Institute, Hsinchu, (Taiwan), Hsinchu (TW)

(72) Inventors: Ho-Chieh Yu, Taoyuan (TW); Chen-Cheng-Lung Liao, Taoyuan (TW); Chun-Yu Lin, Taoyuan (TW); Hsiao-Ming Chang, New Taipei (TW); Jing-Yao Chang, Hsinchu (TW); Tao-Chih Chang, Hsinchu (TW)

(73) Assignees: ICP Technology Co., Ltd., Taoyuan (TW); Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/737,288

(22) Filed: Jan. 8, 2020

(30) Foreign Application Priority Data

Jan. 29, 2019  (TW) .............................. 108103286 A

(51) Int. Cl.
| | |
|---|---|
| *H05K 1/02* | (2006.01) |
| *H05K 1/03* | (2006.01) |
| *H05K 3/34* | (2006.01) |
| *H05K 1/11* | (2006.01) |
| *H05K 3/46* | (2006.01) |
| *H05K 3/40* | (2006.01) |

(52) U.S. Cl.
CPC ......... *H05K 1/0306* (2013.01); *H05K 1/0271* (2013.01); *H05K 1/111* (2013.01); *H05K 3/341* (2013.01); *H05K 3/4015* (2013.01); *H05K 3/4629* (2013.01)

(58) Field of Classification Search
CPC .. H05K 1/0306; H05K 3/4629; H05K 1/0271; H05K 3/341; H05K 3/4015; H05K 1/111
USPC ........................................................ 174/261
See application file for complete search history.

(56) References Cited

U.S. PATENT DOCUMENTS

| | | | | |
|---|---|---|---|---|
| 5,721,455 | A * | 2/1998 | Takashita | ................ H01L 23/34 257/177 |
| 2014/0284088 | A1 * | 9/2014 | Nakamura | ............ C04B 41/009 174/257 |
| 2018/0151794 | A1 * | 5/2018 | Kuroyanagi | ......... H03H 9/0523 |

* cited by examiner

*Primary Examiner* — Sherman Ng
(74) *Attorney, Agent, or Firm* — Wang Law Firm, Inc.

(57) ABSTRACT

A ceramic substrate component suitable for high-power chips includes a ceramic substrate body and at least one raised metal pad. The ceramic substrate body has an upper surface and a lower surface opposite to the upper surface. The raised metal pad includes a base portion and a top layer. The base portion, which is attached to the upper surface of the ceramic substrate body, has a thickness between 10 and 300 micrometers, and a thermal expansion coefficient greater than the ceramic substrate body. The top layer is formed on the base portion and adapted to install a high-power chip thereon. The top layer extends an area less than the base portion but greater than the high-power chip, and has a thermal expansion coefficient greater than the ceramic substrate body. As such, damages due to thermal stress occurring between the base portion and the ceramic substrate body can be mitigated.

8 Claims, 7 Drawing Sheets

CERAMIC SUBSTRATE COMPONENT/ASSEMBLY WITH RAISED THERMAL METAL PAD, AND METHOD FOR FABRICATING THE COMPONENT

FIELD OF THE INVENTION

The present invention relates to a ceramic substrate and, more particularly, to a ceramic substrate component/assembly, and a method for fabricating the component.

BACKGROUND OF THE INVENTION

Compared with traditional substrates for circuit boards, ceramic substrates are excellent in heat dissipation, temperature resistance, reliability, and capable of being made into a thin, small-sized circuit board, and thus they are suitable for high-power chips or dies in electronic products. Both DBC (direct bounded copper) and DBA (direct bounded aluminum) substrates, made of aluminum oxide (Al2O3), are the most commonly used ceramic substrates, wherein the thickness of copper or aluminum layer is generally between 200 and 300 micrometers; when the thickness of copper or aluminum layer is greater than 300 micrometers, because the substrates are easy to suffer interfacial breaks.

With increasing power of chips or dies, the electrical circuit, including pads, traces and conductive layers, on a ceramic substrate need to be thickened. Generally, there is a significant difference between the thermal expansion coefficients of a metal layer and a ceramic substrate. For example, the linear thermal expansion coefficients of copper and aluminum are about 16.5 and 23 ppm/K (at 20 degree C.) respectively, while the liner thermal expansion coefficients of aluminum oxide, aluminum nitride, silicon nitride are about 7, 4.5, 3.5 ppm/K (at 20 degree C.) respectively. The significant difference of thermal expansion coefficients often causes thermal stress at the interface of the circuit layer and the substrate. Under these circumstances, the circuit board easily suffers interfacial breaks, bending or deformation.

To alleviate the problem of existing circuit boards, a technical solution is provided in the present invention, which employs at least one raised or thickened pad of a metal circuit layer on a ceramic substrate for installing a high-power chip, so that most of the temperature difference between the chip and the ceramic substrate is applied across the thickened pad, so that the temperature difference per unit height can be reduced, and thus the thermal stress occurring at the interface between the metal circuit layer and the substrate can be mitigated. Also, the pad can be configured with various thicknesses according to customers' demands.

SUMMARY OF THE INVENTION

One object of the present invention is to provide a ceramic substrate component, which includes a ceramic substrate body provided thereon with a metal circuit layer containing a raised thermal metal pad composed of a top layer and a thinner base portion, wherein the top layer has an area less than the thinner base portion, so that breaks caused at the interface between the metal circuit layer and the ceramic substrate body can be mitigated.

Another object of the present invention is to provide a ceramic substrate component with a raised thermal metal pad so that the component is suitable for installing a high-power chip or die.

A further object of the present invention is to provide a ceramic substrate assembly, which includes a high-power chip or die installed on a ceramic substrate component, which allows the heat produced by the chip to be dissipated properly.

A still further object of the present invention is to provide a method for fabricating a ceramic substrate assembly, whereby a high-power chip can be installed onto a ceramic substrate body so that interfacial damages between pads and the ceramic substrate body can be mitigated while the chips works.

The ceramic substrate component is adapted for installing thereon at least one chip that produces a lot of heat, which generally comprises a ceramic substrate body and at least one raised metal pad. The ceramic substrate body has an upper surface and a lower surface opposite to the upper surface. The raised metal pad includes a base portion and a top layer. The base portion, which is attached to the upper surface of the ceramic substrate body, has a thickness between 10 and 300 micrometers and has a thermal expansion coefficient greater than the ceramic substrate body. The top layer, which is formed on the base portion and adapted to solder or braze a high-power chip thereon, extends an area less than the base portion but greater than the chip. The top layer has a thermal expansion coefficient greater than the ceramic substrate body. As such, damages due to thermal stress occurring at the interface between the base portion and the ceramic substrate body can be mitigated.

The ceramic substrate assembly is obtained by installing a high-power chip onto the ceramic substrate component. Accordingly, the ceramic substrate assembly comprises at least one chip that produces a lot heat, a ceramic substrate body, and at least one raised metal pad. The ceramic substrate body has an upper surface and a lower surface opposite to the upper surface. The raised metal pad includes a base portion and a top layer. The base portion, which is attached to the upper surface of the ceramic substrate body, has a thickness between 10 and 300 micrometers and has a thermal expansion coefficient greater than the ceramic substrate body. The top layer is formed on the base portion, and the chip is placed on the top layer and soldered or brazed in place. The top layer extends an area less than the base portion but greater than the chip, and has a thermal expansion coefficient greater than the ceramic substrate body. As such, damages due to thermal stress occurring at the interface between the base portion and the ceramic substrate body can be mitigated.

The method for fabricating a ceramic substrate component that includes a ceramic substrate body having an upper surface and a lower surface and provided with a raised metal pad for soldering at least one high-power chip thereon comprises the steps of: (a) forming a seed layer by sputtering a target metal onto the upper surface of the ceramic substrate body such that the seed layer has a thickness less than 1 micrometer; (b) forming a build-up layer of metal on the seed layer such that the seed layer and the build-up layer constitute a base portion having a thickness between 10 and 300 micrometers, and having a thermal expansion coefficient greater than the ceramic substrate body, so as to reduce damages caused by thermal stress occurring between the base portion and the ceramic substrate body; and (c) forming a top layer of metal on the base portion to extend an area less than the base portion such that the top layer and the base portion constituting the raised metal pad, the top layer having a thermal expansion coefficient greater than the ceramic substrate body.

Compared with conventional technology, the present invention is featured in a raised thermal metal pad, including a thinner base portion and a thicker top layer, on a ceramic substrate body, wherein the base portion has an area greater than the top layer. Therefore, the temperature difference per unit thickness of the metal pad can be reduced, while the extensibility of the base portion can be increased, so that the ceramic substrate body is suitable for a high-power chip, and damages caused by thermal stress occurring at the interface of the pad and the ceramic substrate body can be mitigated.

The foregoing and other features and advantages of illustrated embodiments of the present invention will be more readily apparent from the following detailed description, which proceeds with reference to the accompanying drawings.

DETAILED DESCRIPTION OF THE ILLUSTRATED EMBODIMENTS

The foregoing and other technical contents, features and advantages of the present invention will be illustrated in detail by way of exemplary embodiments in the following paragraphs with reference to the accompanying drawings.

The drawings accompanying with the specification show the structural features of elements used in the present invention, which may be depicted in a size or proportion to be easily understood by those skilled in the art without changing the subject matter of the present invention.

Figure 1:
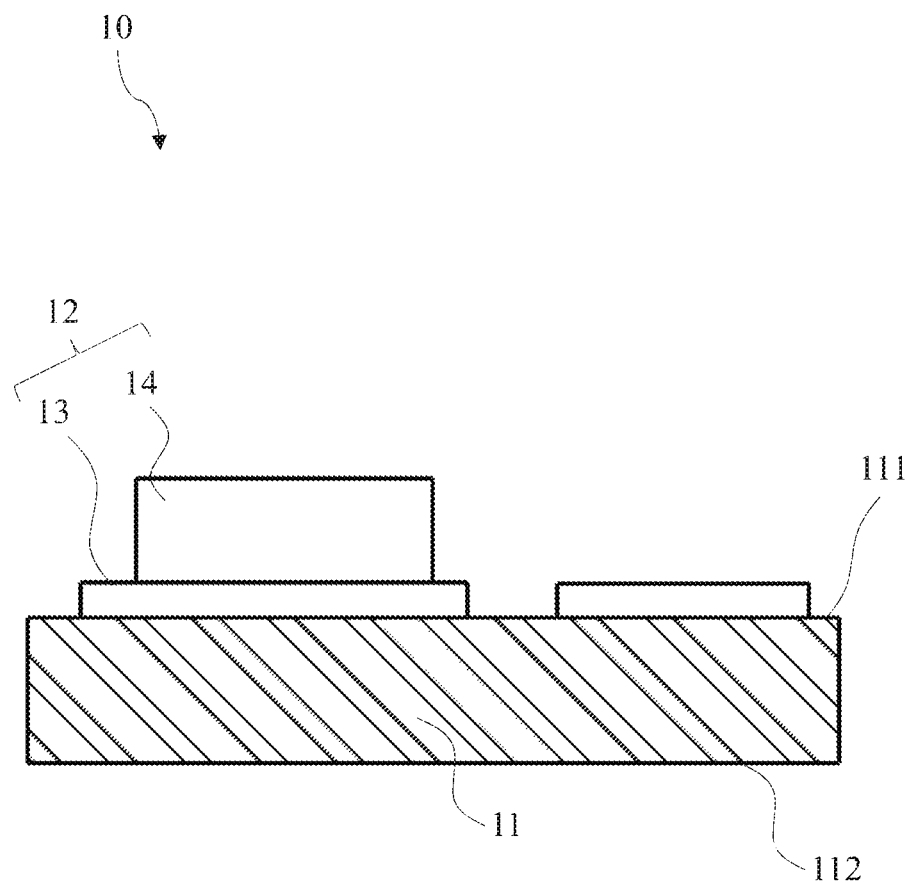
FIG. 1 shows a side view of a first embodiment of a ceramic substrate component according to the present invention.

FIG. 1 shows a first embodiment of a ceramic substrate component according to the present invention. The ceramic substrate component, indicated by reference numeral 10, comprises a ceramic substrate body 11 and a raised metal pad 12, wherein the ceramic substrate body 11 has an upper surface 111 and a second surface 112 opposite to the upper surface 111; the raised metal pad 12 includes a base portion 13 and a top layer 14. The base portion 13 can be formed by sputtering copper onto the upper surface 111 of the ceramic substrate body and subsequently performing an electroplating process to reach a thickness of copper between 10 and 300 micrometers. Since copper has a linear thermal expansion coefficient of about 17 ppm/K while general ceramic substrates, such as aluminum oxides, aluminum nitrides or silicon nitrides, have a thermal expansion coefficient of 4 to 7 ppm/K, the use of the thinner base portion 13 leads to better extensibility or ductility. Thereafter, the substrate product can be coated with a photo-resist (a photo-sensitive material) and then exposed with proper radiation so that unwanted portion of the photo-resist can be removed to expose part of the base portion 13, which can be further electroplated thereon with copper to form the top layer 14 that is thicker and extends an area less than the base portion 13. On the top layer, a high-power chip can be soldered or brazed. As such, the thicker top layer can take a significant portion of the temperature difference existing between the chip and the substrate, while the extensible base portion 13 can keep contact with the ceramic substrate body without being damaged caused by thermal stress.

The base portion and the top layer can be further processed by general routines to form a metal circuit according to a design pattern. The raised metal pad can work as a solder pad or a land for attachment of an electronic component. Of course, other ways of providing copper, such as evaporation or electroless plating, and/or other metals suitable for the base portion and the top layer can also be used.

Figure 2:
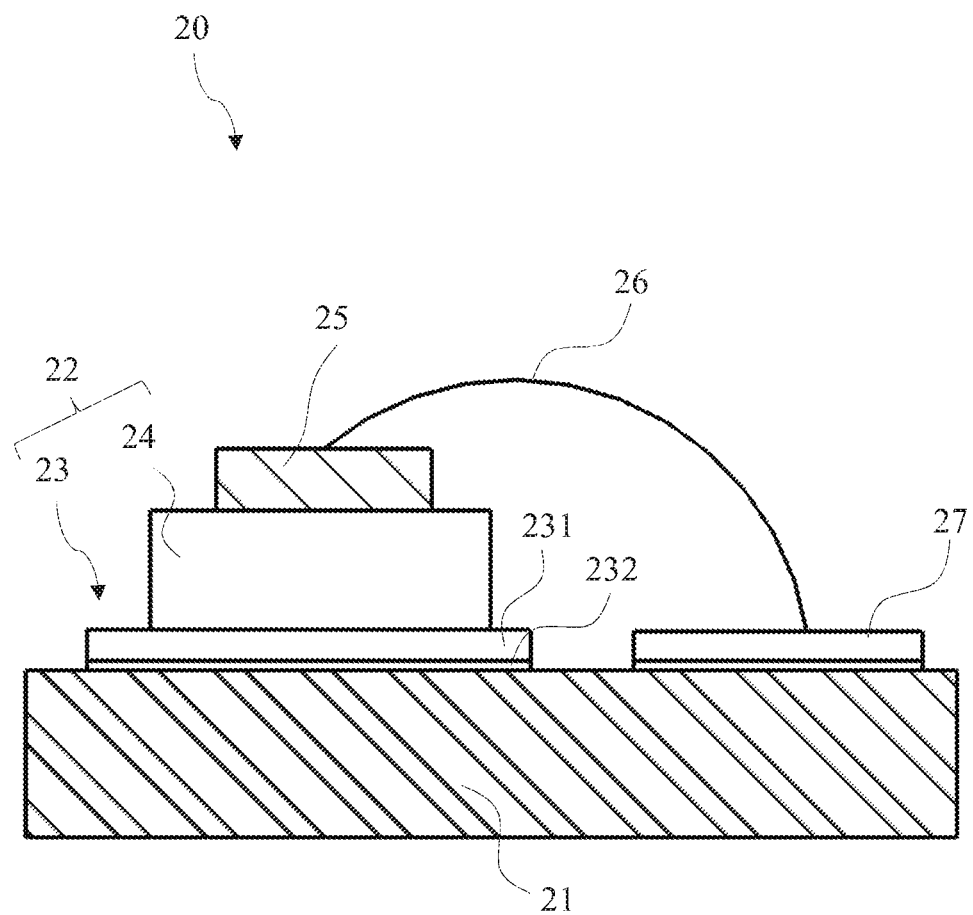
FIG. 2 shows a side view of an embodiment of a ceramic substrate assembly according the present invention, wherein a high-power chip is installed on a ceramic substrate component.

FIG. 2 shows one embodiment of a ceramic substrate assembly or package according the present invention. In this embodiment, a high-power chip 25, which can produce a lot of heat, refers to an IGBT (insulated gate bipolar transistor) device. The high-power chip 25 can be soldered on the raised metal pad 22 via SMT (surface-mount technology). As show, the raised metal pad 22 includes a base portion 23 and a top layer 24. The base portion 23 is composed of a first thin layer 232 (seed layer), and a second thin layer 231 (build-up layer). The first thin layer 232 formed of titanium/copper and having thickness less than 0.5 micrometer is firstly attached on the upper surface of the ceramic substrate body by sputtering technique. The second thin layer 231 can be formed on the first thin layer 232 by electroplating technique. The top layer 24 can be formed on the second thin layer 231 by electroplating to reach a thickness suitable for the high-power chip 25 according to the specification thereof. Generally, the thickness of the top layer 24 is greater than that of the base portion 23. After the high-power chip 25 has been fixed onto the top layer 24 by soldering or brazing, metal wires 26 can be connected between bond pads (not shown) of the chip 25 and corresponding metal pads 27, so that the chip 25 can work properly (in FIG. 2, only one metal wire is shown).

Due to various advantages, such as high efficiency and fast switching capability, IGBT devices are often used in electrical equipment that performs heavy work, such as air conditioners, refrigerators, stereos, and motor drives. In operation of such equipment, the IGBT devices can produce a lot of heat. With the thicker top layer 24, the raised metal pad 22 can take more heat than ordinary pads. Also, since the thermal expansion coefficients of the top layer 24 and the second thin layer 231 are approximately equal, thermal stress resulting from different thermal expansion coefficients is low, and thus does not cause damages between the two layers. On the other hand, the base portion 23, composed of the first thin layer 232 and the second thin layer 231, has a thinner thickness than the top layer 24 and extends an area greater than the top layer 24, which leads the base portion 23 to have better extensibility or ductility than the top layer 24. Even though the base portion 23 has a different thermal expansion coefficient than the substrate body 21, the base portion 23 allows to be extended over the substrate body 21 more freely to reduce the thermal stress caused by thermal expansion, thus reducing interface breaks.

FIGS. 3A through 3K show a method for fabricating a ceramic substrate assembly or package. The method is based on a process the technique of DPC (direct plating copper), which is superior over the technique of DBC (direct bonding copper) in designing a stable substrate assembly. With the DPC technique, the flexibility of designing a ceramic substrate assembly and the bonding strength between the metal and the ceramic substrate body can be increased, while the ratio of gaps existing between the metal and the ceramic substrate body can be reduced.

Figure 3A:
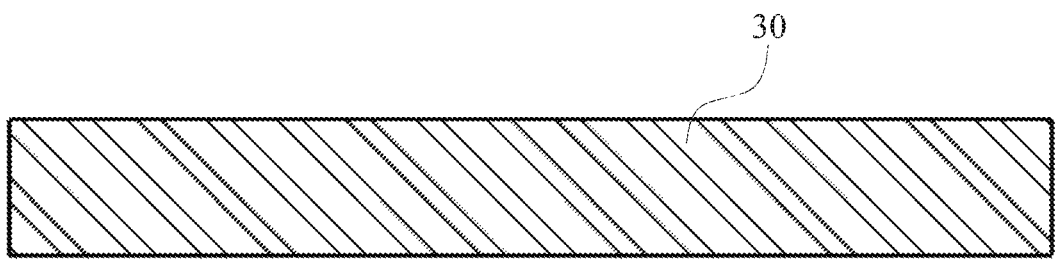
FIGS. 3A through 3K show side views of temporary products during fabrication of the ceramic substrate assembly according to the present invention.
Figure 3B:
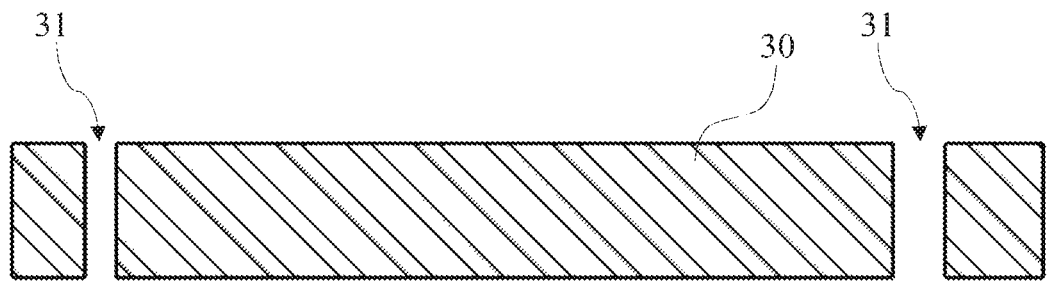
Figure 3C:
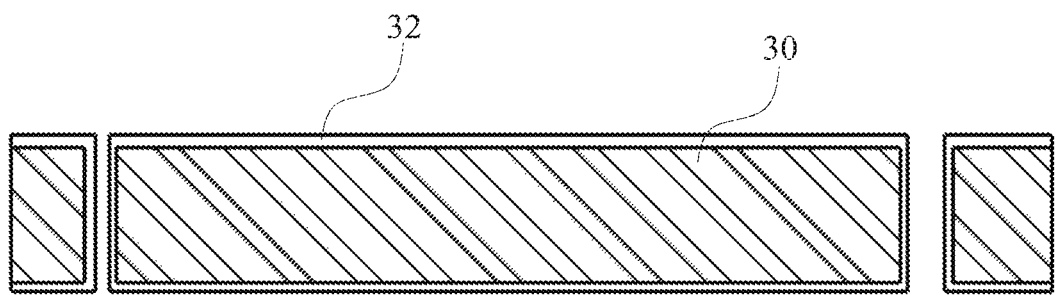
Figure 3D:
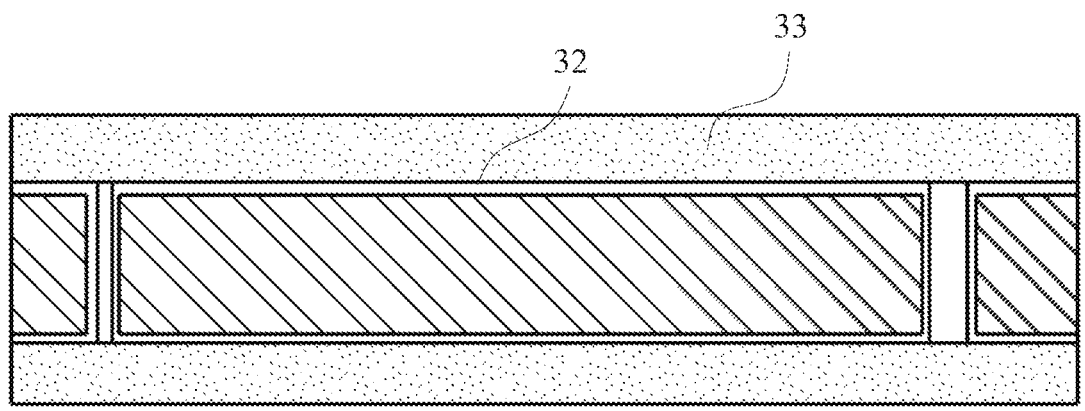
Figure 3E:
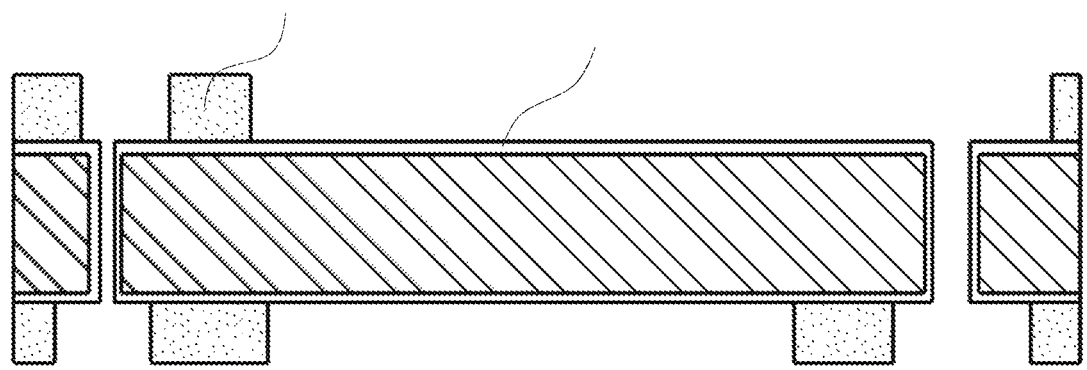
Figure 3F:
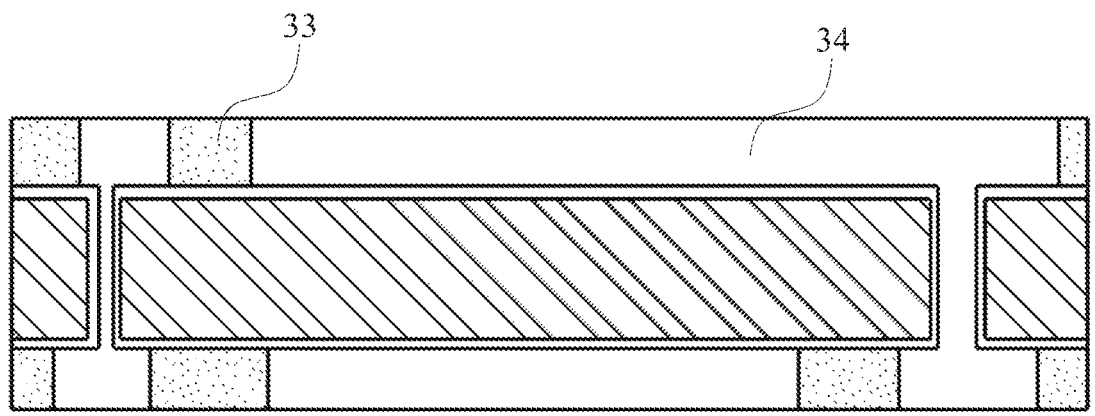

FIG. 3A shows a ceramic substrate body 30 made of Aluminum Oxide (Al2O3) or Aluminum Nitride (AlN). Firstly, the ceramic substrate body 30 can be drilled to form a through hole 31, as shown in FIG. 3B. Secondly, the ceramic substrate body 30 can be sputtered with titanium/copper to form a first thin layer 32 thereon, as shown in FIG. 3C. Thirdly, a first layer 33 of photo-resist can be applied on the first thin layer 32, as shown in FIG. 3D, and then the photo-resist can be exposed under a radiation lamp and then treated with a development process to remove unwanted photo-resist and thus to form a first remained photo-resist layer 33, as shown in FIG. 3E. Fourthly, the first thin layer 32 can be electroplated with copper to form a second thin layer 34, as shown in FIG. 3F, wherein the first and second thin layers 32, 34 will constitute a base portion of the raised metal pad.

Figure 3G:
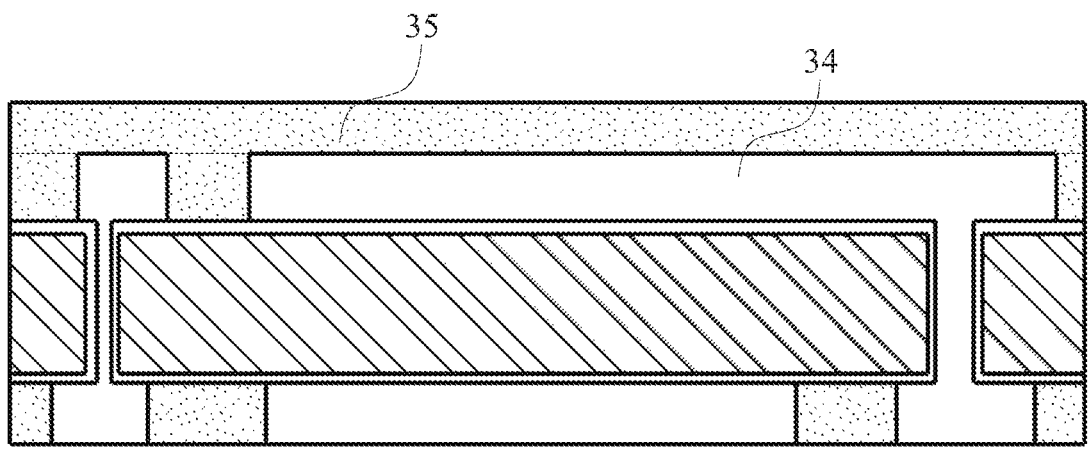
Figure 3H:
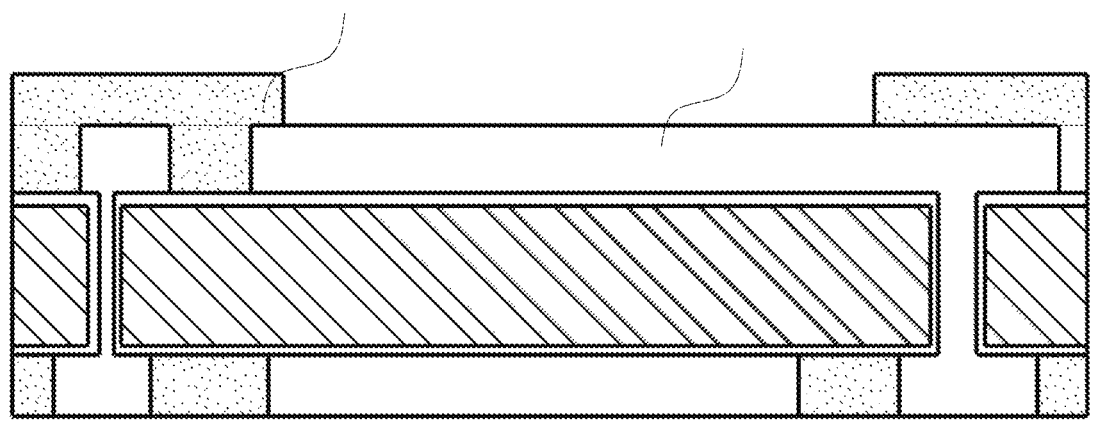
Figure 3I:
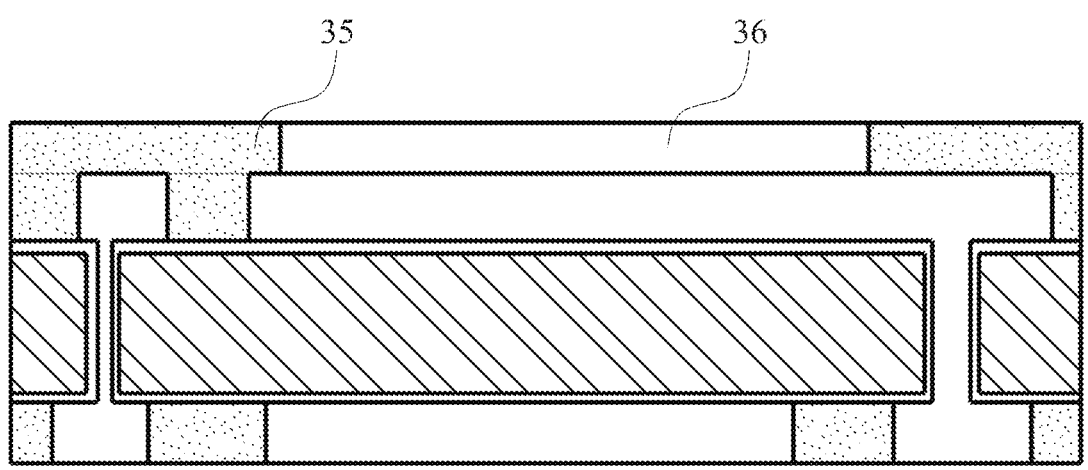
Figure 3J:
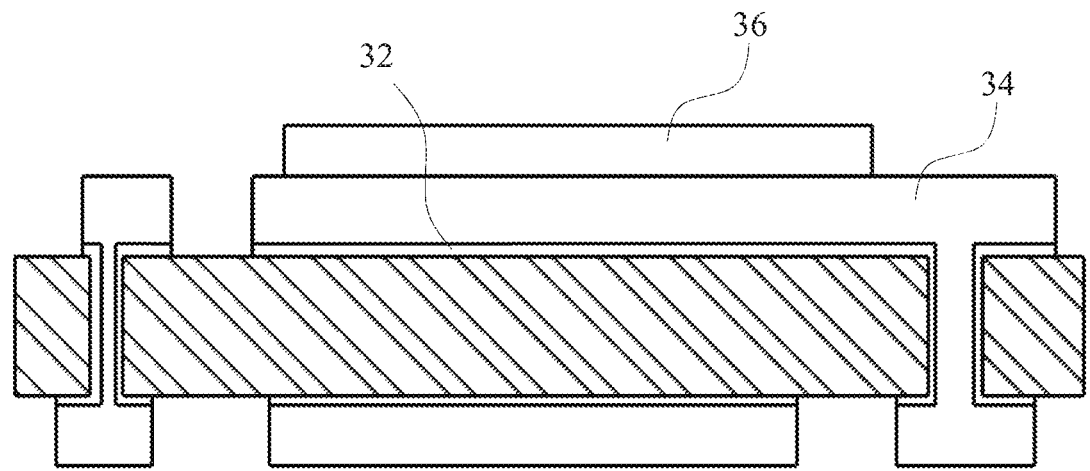
Figure 3K:
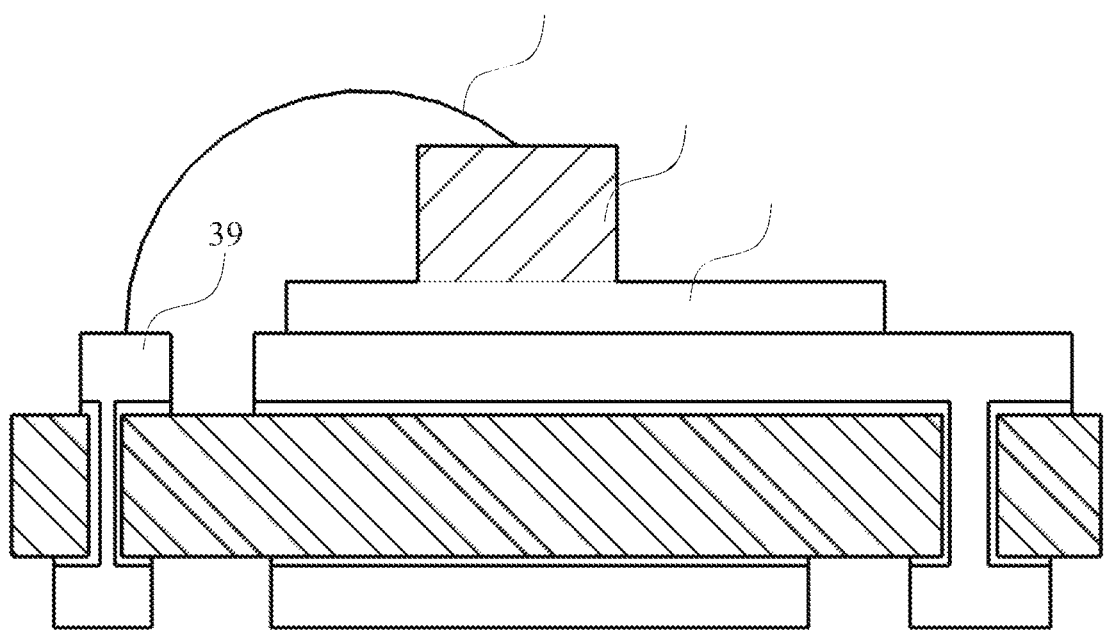

Fifthly, a second layer 35 of photo resist can be applied on top of the second thin layer 34 and the first remained photo resist layer 33, as shown in FIG. 3G Sixthly, the second photo-resist layer 35 can be exposed under a radiation lamp and then treated with a development process to remove unwanted photo resist, thus forming a second remained photo-resist layer and exposing the second thin layer 34, as shown in FIG. 3H. Seventhly, a top layer 36 of copper can formed on the second thin layer 34 by electroplating and extends an area less than the second thin layer 34, as shown in FIG. 3I. Eighthly, all of the remained photo resist can be removed from the ceramic substrate body, and then portions of the first thin layer 32 (uncovered by the second thin layer 34) can be etched away, thus obtaining a ceramic substrate component containing a circuit layer according to a design pattern, as shown in FIG. 3J. Ninthly, a high-power chip 37 can be installed on to the ceramic substrate component, wherein the chip's back (ground) can be soldered or brazed onto the top layer 36 and fixed in place; a metal wire 38 is soldered or brazed between one bond pad of the chip (not shown) and a metal pad 39 of the circuit layer, as shown in FIG. 3K. Finally, a sealing or encapsulation process can be performed so as to protect the chip and metal wire on the ceramic substrate component.

Of course, those skilled in the art can understand that alternative steps can be performed to fabricate the ceramic substrate assembly of the present invention. For example, the first and second thin layers on the ceramic substrate body can be replaced by a piece of copper foil. Alternatively, the ceramic substrate body can be electroplated with copper so that an initial copper layer having a thickness equal to the total thickness of a top layer and a base portion is formed on the substrate, and then unwanted portions of the initial copper layer can be removed through imaging (light exposure), developing and etching process to obtain a raised metal pad.

Figure 4:
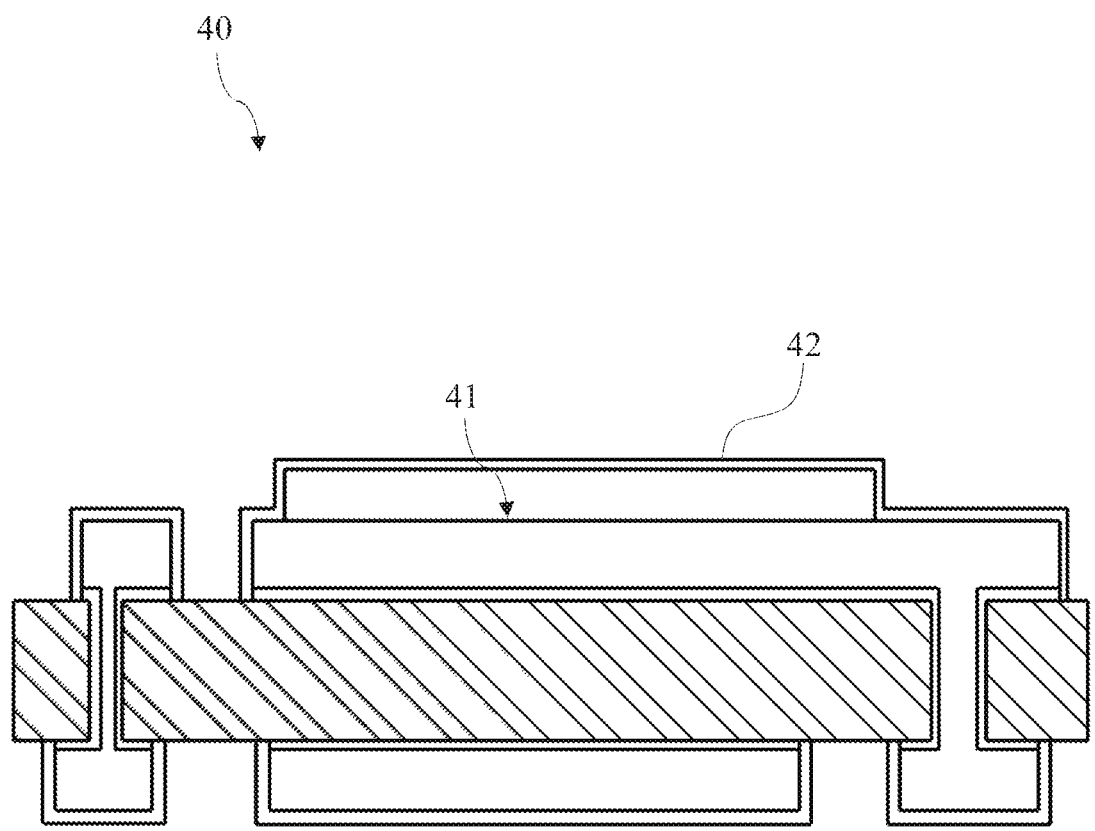
FIG. 4 shows a side view of a second embodiment of the ceramic substrate component according to the present invention.

FIG. 4 shows a second embodiment of the ceramic substrate component, which is the same as the one shown in FIG. 3J except for the base portion and/or the top layer being coated with a protective layer 42, which protects the copper of the raised metal pad 41 and other pads from oxidation, thus improving solderability and conductivity of the pads. The protective layer 42 can be formed of gold, silver, palladium, or nickel by using hot gas over a layer of solder paste containing protective metals (reflow technique), organic coating technique, or electroless plating technique.

As a summary, the ceramic substrate component/assembly of the present invention employs a raised thermal metal pad including a thicker top layer to take a significant portion of temperature difference existing between a high-power chip and a ceramic substrate body, and a thinner base portion under the top layer. The thickness of the top layer depends on the power or heat generation of the chip. The base portion, which has an area greater than the top layer, can be extended more easily than the top layer to reduce the thermal stress caused by different thermal expansions of the base portion and the ceramic substrate body, thus reducing interfacial breaks.

While the invention has been described with reference to the preferred embodiments above, it should be recognized that the preferred embodiments are given for the purpose of illustration only and are not intended to limit the scope of the present invention and that various modifications and changes, which will be apparent to those skilled in the relevant art, may be made without departing from the scope of the invention.

What is claimed is:

1. A ceramic substrate component suitable for at least one high-power chip that produces a lot of heat, comprising:
    a ceramic substrate body having an upper surface and a lower surface opposite to the upper surface; and
    at least one raised metal pad, which includes:
        a base portion attached to the upper surface of the ceramic substrate body, the base portion having a thickness between 10 and 300 micrometers and having a thermal expansion coefficient greater than the ceramic substrate body; and
        a top layer formed on the base portion and adapted to solder or braze a high-power chip thereon, the top layer extending an area less than the base portion but greater than the high-power chip, the top layer having a thermal expansion coefficient greater than the ceramic substrate body;
    whereby damages due to thermal stress occurring between the base portion and the ceramic substrate body can be mitigated.

2. The ceramic substrate component of claim 1, wherein the first thin layer is formed of titanium and copper, while the second thin layer and the top layer are formed of copper.

3. The ceramic substrate component of claim 1, further comprising a protective layer formed on an outer surface of the raised metal pad.

4. A ceramic substrate assembly, comprising:
    at least one chip that produces a lot of heat;
    a ceramic substrate body having an upper surface and a lower surface opposite to the upper surface; and
    at least one raised metal pad, which includes:
        a base portion attached to the upper surface of the ceramic substrate body, the base portion having a thickness between 10 and 300 micrometers and having a thermal expansion coefficient greater than the ceramic substrate body; and
        a top layer formed on the base portion to solder or braze the chip thereon, the top layer extending an area less than the base portion but greater than the chip, the top layer having a thermal expansion coefficient greater than the ceramic substrate body;
    whereby damages due to thermal stress occurring between the base portion and the ceramic substrate part can be mitigated.

5. The ceramic substrate assembly of claim 4, further comprising a protective layer formed on an outer surface of the raised metal pad.

6. In a method for fabricating a ceramic substrate assembly that includes a ceramic substrate body having an upper surface and a lower surface and provided with a raised metal pad suitable for soldering or brazing at least one high-power chip thereon, the method comprising:

(a) forming a seed layer by sputtering a target metal onto the upper surface of the ceramic substrate body such that the seed layer has a thickness less than 1 micrometer;

(b) forming a build-up layer of metal on the seed layer such that the seed layer and the build-up layer constitute a base portion having a thickness between 10 and 300 micrometers and having a thermal expansion coefficient greater than the ceramic substrate body, so that damages due to thermal stress occurring between the base portion and the ceramic substrate body can be mitigated; and (c) forming a top layer of metal on the base portion to extend an area less than the base portion such that the top layer and the base portion constituting the raised metal pad, the top layer having a thermal expansion coefficient greater than the ceramic substrate body.

7. The method of claim 6, further comprising:

(d) coating an outer surface of combination of the base portion and the top layer with a protective layer.

8. The method of claim 6, further comprising:

(d) fixing the chip onto the top layer and connecting metal wires between bond pads of the chip and corresponding metal pads on the ceramic substrate body; and (e) performing a sealing process over the chip and the metal wires on the ceramic substrate body.

* * * * *